(12) United States Patent
Yamakawa

(10) Patent No.: US 10,629,809 B2
(45) Date of Patent: Apr. 21, 2020

(54) SEMICONDUCTOR MEMORY DEVICE (71) Applicant: TOSHIBA MEMORY CORPORATION, Minato-ku, Tokyo (JP)

(72) Inventor: Koji Yamakawa, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/285,109

(22) Filed: Feb. 25, 2019

(65) Prior Publication Data
US 2020/0044149 A1 Feb. 6, 2020

(30) Foreign Application Priority Data

Aug. 6, 2018 (JP) .................. 2018-147332

(51) Int. Cl.
H01L 45/00 (2006.01)
H01L 27/24 (2006.01)

(52) U.S. Cl.
CPC .......... H01L 45/06 (2013.01); H01L 27/2481 (2013.01); H01L 45/1253 (2013.01); H01L 45/141 (2013.01); H01L 45/1616 (2013.01); H01L 45/1675 (2013.01)

(58) Field of Classification Search
CPC . H01L 45/06; H01L 45/1233; H01L 27/2463; H01L 27/2409; H01L 27/2481
See application file for complete search history.

(56) References Cited

U.S. PATENT DOCUMENTS

| 9,401,474 | B2* | 7/2016 | Kim ................. H01L 45/16 |
| 9,704,923 | B1* | 7/2017 | Bernhardt ............ H01L 23/528 |
| 10,128,437 | B1* | 11/2018 | Fantini ................. H01L 45/141 |
| 2007/0096162 | A1 | 5/2007 | Happ et al. |
| 2007/0235710 | A1 | 10/2007 | Matsuzaki et al. |
| 2008/0283812 | A1 | 11/2008 | Liu |

FOREIGN PATENT DOCUMENTS

JP  5274799 B2  5/2013

* cited by examiner

Primary Examiner — Allison Bernstein
(74) Attorney, Agent, or Firm — Foley & Lardner LLP (57) ABSTRACT A semiconductor memory device includes a first electrode and a second electrode opposed to each other in a first direction, a phase-change film provided between the first electrode and the second electrode, a first film formed of an insulator provided on a side surface of the phase-change film in a second direction intersecting the first direction, and a second film formed of a conductor containing carbon and provided along a side surface of the phase-change film in the second direction with the first film interposed between the second film and the side surface.

20 Claims, 9 Drawing Sheets

SEMICONDUCTOR MEMORY DEVICE

CROSS-REFERENCE TO RELATED APPLICATIONS

This application is based upon and claims the benefit of Japanese Patent Application No. 2018-147332, filed on Aug. 6, 2018, the entire contents of which are incorporated herein by reference.

BACKGROUND

Field

Embodiments of the present invention relates to a semiconductor memory device.

Description of the Related Art

As a semiconductor memory device for storing large amounts of data, resistance-change type semiconductor memory devices that store information by changing resistance value of memory cells are known. Among such devices, a phase change memory (PCM) uses a phase-change film as a memory cell to store information by using the fact that resistance values of the phase-change film in a crystalline state and in an amorphous state differ from each other by several orders of magnitude.

DETAILED DESCRIPTION

A semiconductor memory device according to one embodiment includes a first electrode and a second electrode opposed to each other in a first direction, a phase-change film provided between the first electrode and the second electrode, a first film formed of an insulator provided on a side surface of the phase-change film facing in a second direction intersecting the first direction, and a second film formed of a conductor containing carbon and provided along the side surface of the phase-change film in the second direction with the first film interposed between the second film and the side surface.

A semiconductor memory device according to another embodiment includes a first electrode and a second electrode opposed to each other in a first direction, a phase-change film provided between the first electrode and the second electrode, a first film provided on a side surface of the phase-change film in a second direction intersecting the first direction, and a second film provided along the side surface of the phase-change film in the second direction with the first film interposed between the second film and the side surface, wherein the first film is formed of an insulator and the second film is formed of a conductor having a thermal conductivity in an in-plane direction that is greater than the thermal conductivity in a film-thickness direction.

A semiconductor memory device according to yet another embodiment includes a first wiring extending in a first direction, a second wiring extending in a second direction intersecting the first direction, a third wiring adjacent to the second wiring in the first direction and extending in the second direction, a first stacked structure provided between the first wiring and the second wiring and including a first resistance change layer and a first electrode, a second stacked structure provided between the first wiring and the third wiring and including a second resistance change layer and a second electrode, a first film provided between the first stacked structure and the second stacked structure and in contact with the first stacked structure, and a second film provided between the second stacked structure and the first film and formed of a conductor that is in contact with the first film and contains carbon.

Semiconductor memory devices according to embodiments will be descried below in detail with reference to the drawings. It should be noted that the following embodiments are illustrated merely as examples and are not intended to limit the present invention.

First Embodiment

[Configuration]

Figure 1:
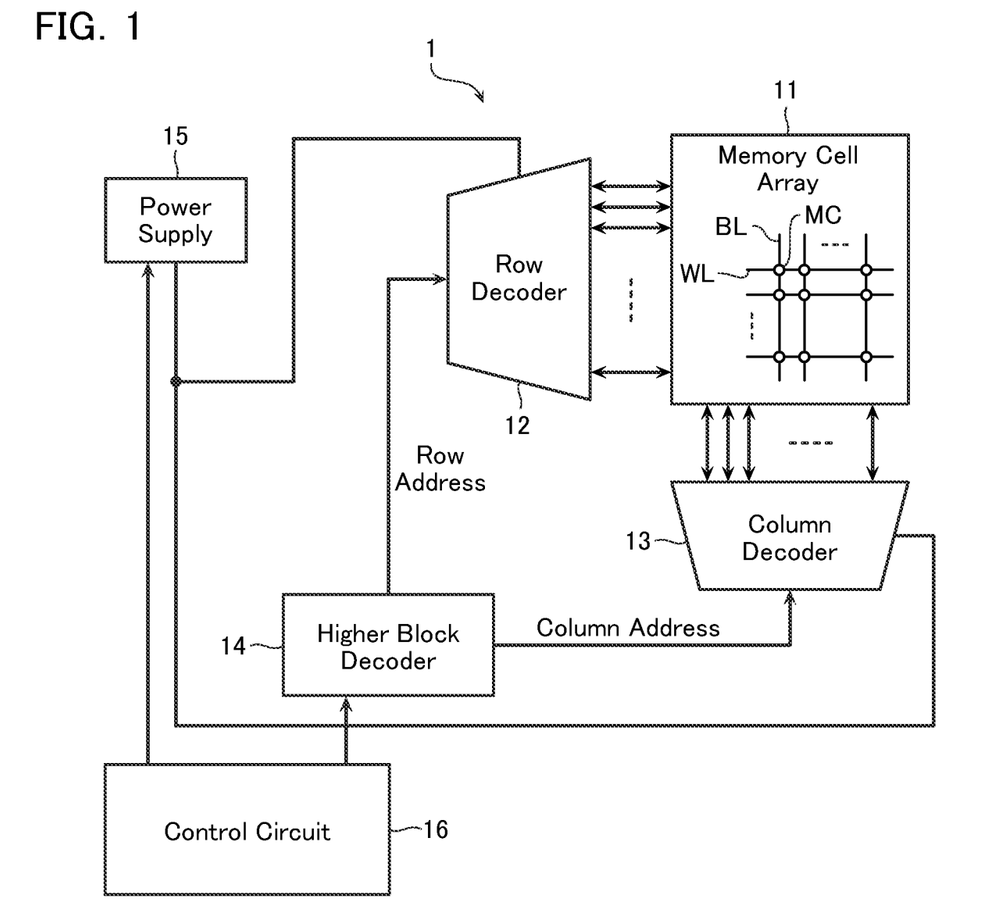
FIG. 1 is a block diagram of a semiconductor memory device according to a first embodiment.

FIG. 1 is a block diagram of a semiconductor memory device according to a first embodiment.

The semiconductor memory device 1 according to the present embodiment includes a memory cell array 11, a row decoder 12 and a column decoder 13 configured to select a desired memory cell MC from the memory cell array 11, a higher block decoder 14 configured to provide row addresses and column addresses to those decoders 12 and 13, a power supply 15 configured to supply power to components of the semiconductor memory device 1, and a control circuit 16 configured to control these components.

The memory cell array 11 includes a plurality of memory cells MC each storing one bit or a plurality of bits of data. The memory cell array 11 is configured to allow a desired memory cell MC to be accessed (to delete/write/read data) by applying a predetermined voltage to a desired bit line BL and word line WL selected by the row decoder 12 and the column decoder 13.

Figure 2:
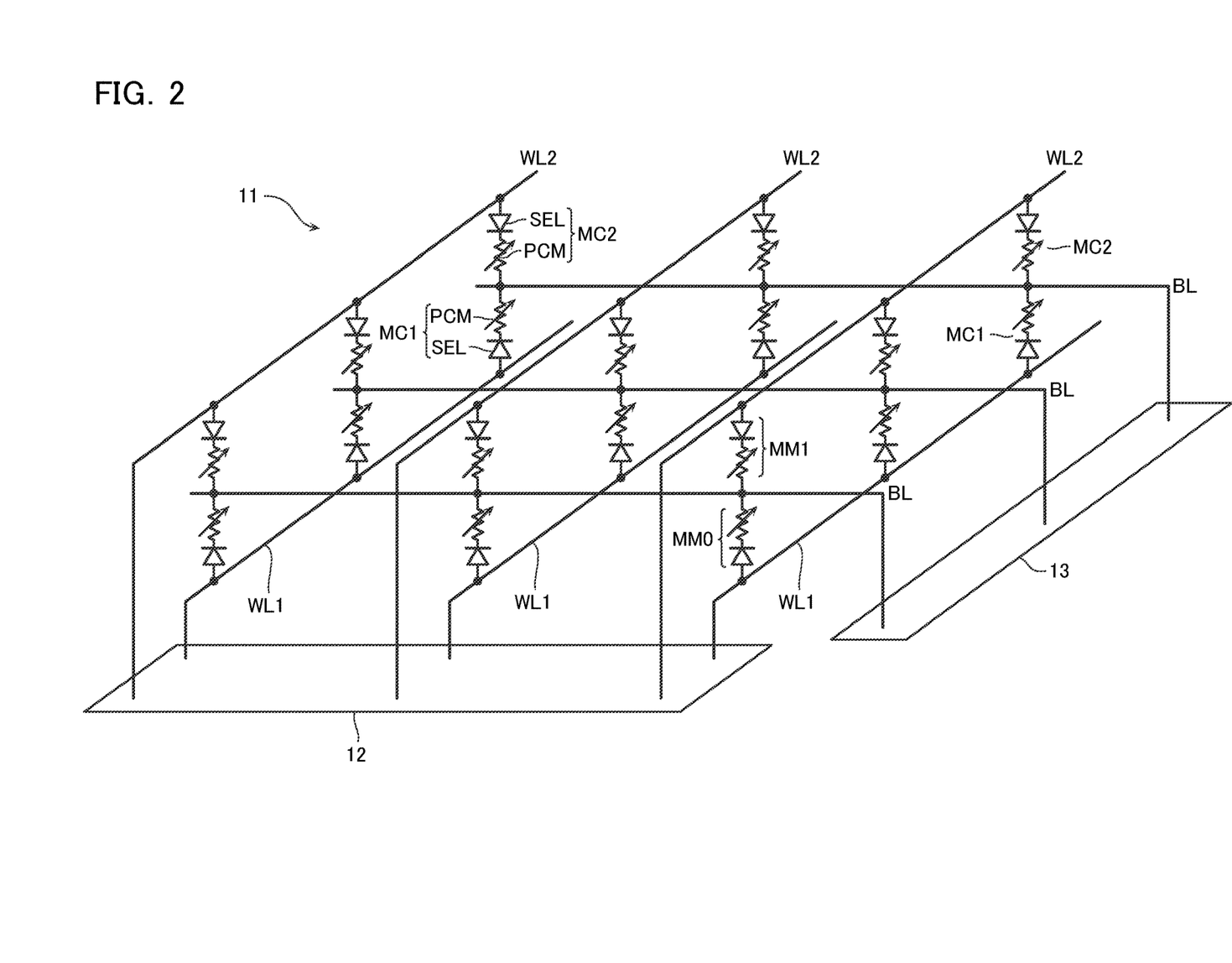
FIG. 2 is a circuit diagram showing a configuration of a memory cell array of the semiconductor memory device.

FIG. 2 is an equivalent circuit diagram showing a configuration of a part of the memory cell array 11. The memory cell array 11 includes a plurality of bit lines BL, a plurality of word lines WL1, WL2, and a plurality of memory cells MC1, MC2 connected to the bit lines BL and the word lines WL1, WL2.

The memory cells MC1, MC2 are connected to the row decoder 12 via the word lines WL1, WL2 and are also connected to the column decoder 13 via the bit lines BL. Each of the memory cells MC1, MC2 stores one bit of data, for example. The plurality of memory cells MC1, MC2 connected to the common word lines WL1, WL2 store one page of data, for example.

Each of the memory cells MC1, MC2 is configured with a series circuit of a phase change film PCM and a selector SEL. The phase change film PCM can be in two kinds of states that are a crystalline state with low resistance and an amorphous state with high resistance in response to current patterns (heating patterns), thereby the phase change film PCM functions as a variable resistance element. By associating those two kind of resistance-value states with information of "0" and "1", the phase-change film PCM can be functioned as the memory cell. Further, the selector SEL of each of the memory cells MC1, MC2 functions as a rectifying element. Accordingly, little current flows through the word lines WL1, WL2 except selected word lines WL1, WL2.

It should be noted that a configuration including the plurality of bit lines BL, the plurality of word lines WL1, and the plurality of memory cells MC1 corresponding to a first layer of the memory cell array 11 will be hereinafter referred to as a memory mat MM0. Similarly, a configuration including the plurality of bit lines BL, the plurality of word lines WL2, and the plurality of memory cells MC2 corresponding to a second layer of the memory cell array 11 will be referred to as a memory mat MM1.

Figure 3:
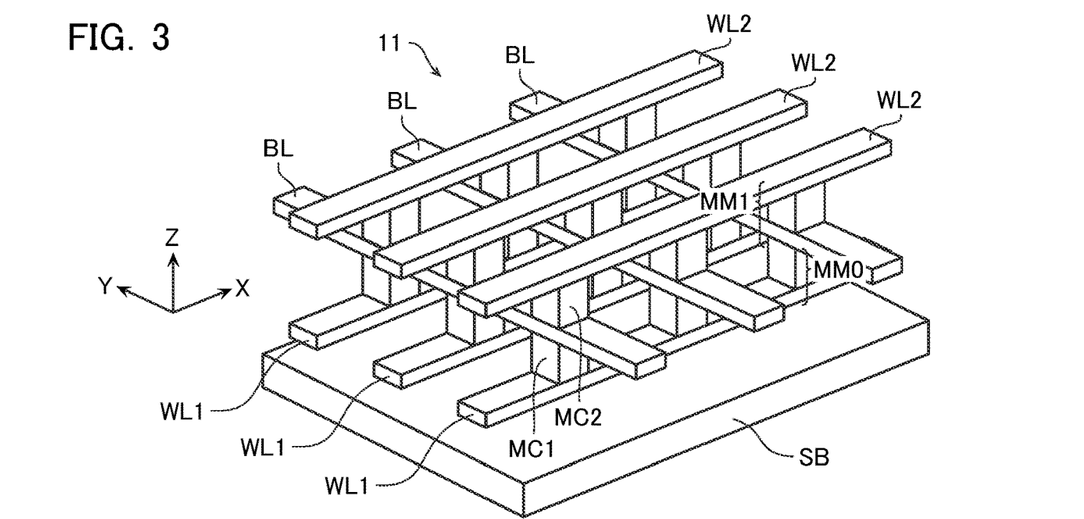
FIG. 3 is a perspective view showing a configuration of the memory cell array.

FIG. 3 is a schematic perspective view showing a configuration of a part of the memory cell array 11. The memory cell array 11 in this example is a so-called cross-point type memory cell array. That is, above a semiconductor substrate SB, a plurality of word lines WL1 are provided that are disposed at a predetermined distance apart from each other in a Y direction that is parallel to an upper surface of the semiconductor substrate SB and extend in parallel to an X direction that is parallel to the upper surface of the semiconductor substrate SB and intersects the Y direction. Above the plurality of word lines WL1, a plurality of bit lines BL are provided that are disposed at a predetermined distance apart from each other in the X direction and extend in parallel to the Y direction. Further, above the plurality of bit lines BL, a plurality of word lines WL2 are provided that are disposed at a predetermined distance from each other in the Y direction and extend in parallel to the X direction. Further, the memory cell MC1 is provided at each of intersections between the plurality of word lines WL1 and the plurality of bit lines BL. Similarly, the memory cell MC2 is provided at each of intersections between the plurality of bit lines BL and the plurality of word lines WL2. It should be noted that while the memory cells MC1, MC2 are rectangular columns in this example, the memory cells MC1, MC2 may be cylindrical.

Figure 4A:
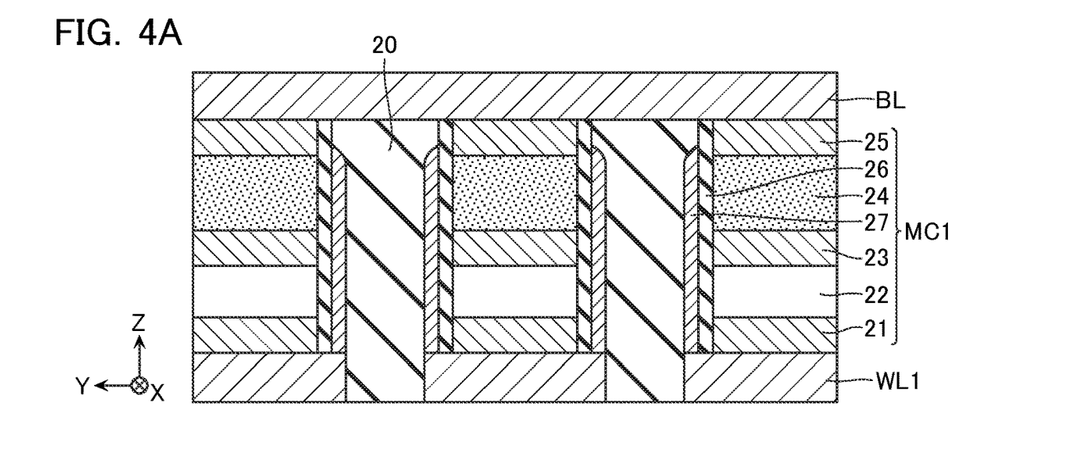
FIGS. 4A and 4B are cross-sectional views showing a configurations of a memory mat of the semiconductor memory device.
Figure 4B:
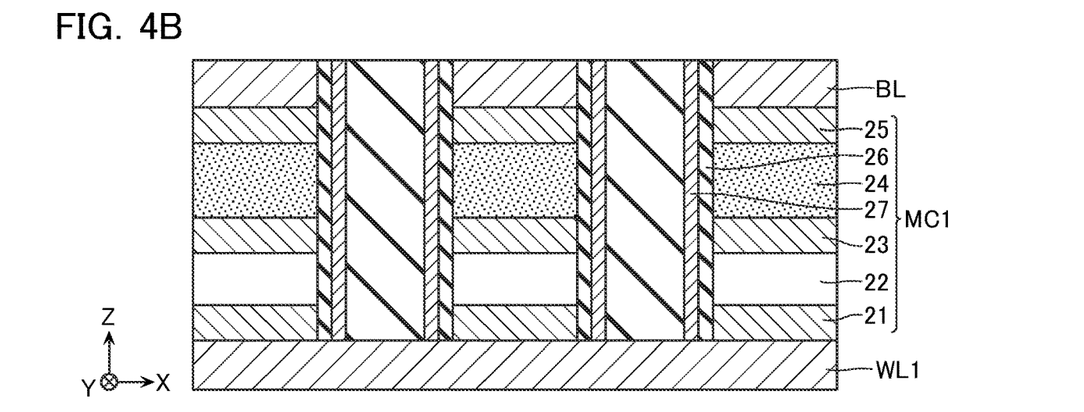

FIGS. 4A and 4B are cross-sectional views showing a configuration of a part of the memory mat MM0. FIG. 4A shows a cross-section orthogonal to the X direction, and FIG. 4B shows a cross-section orthogonal to the Y direction. It should be noted that the direction away from the semiconductor substrate SB (FIG. 3) along the Z direction will be sometimes referred to as "above" and the direction approaching the semiconductor substrate SB along the Z direction will be sometimes referred to as "below" in the following description.

The memory mat MM0 includes the word lines WL1 that are disposed closer to the semiconductor substrate SB and extend in the X direction, the bit lines BL that are disposed on the side opposite from the semiconductor substrate SB with respect to the word lines WL1 and extend in the Y direction, the memory cells MC1 disposed between the word lines WL1 and the bit lines BL, and an insulating layer 20 provided between side surfaces of the plurality of memory cells MC1 in the XY directions.

The memory cell MC1 is configured with a lower electrode layer 21, a selector layer 22 (selector SEL), an intermediate electrode layer 23 (first electrode), a phase-change film 24 (phase-change film PCM), and an upper electrode layer 25 (second electrode) which are stacked in this order in the Z direction (first direction) orthogonal to the X direction and the Y direction from the word line WL1 side toward the bit line BL side. An insulating film 26 (first film) is provided on the side surfaces of the lower electrode layer 21, the selector layer 22, the intermediate electrode layer 23, the phase-change film 24 and the upper electrode layer 25 in the Y direction and the X direction. A conducting film 27 (second film) is provided along the side surfaces of the lower electrode layer 21, the selector layer 22, the intermediate electrode layer 23, the phase-change film 24 and the upper electrode layer 25 in the Y direction and the X direction with the insulating film 26 interposed between the conducting film 27 (second film) and the side surfaces. The insulating film 26 extends from the upper surface of the word line WL1 to the lower surface of the bit line BL in a cross-section orthogonal to the X direction illustrated in FIG. 4A and extends from the upper surface of the word line WL to a position above the bit line BL in a cross-section orthogonal to the Y direction illustrated in FIG. 4B. The conducting film 27 extends from the upper surface of the word line WL1 to a position above the phase-change film 24 and below the lower surface of the bit line BL in the cross-section orthogonal to the X direction illustrated in FIG. 4A and extends from the upper surface of the word line WL to a position above the bit line BL in the cross-section orthogonal to the Y direction illustrated in FIG. 4B. The word lines WL1, the bit lines BL, the lower electrode layer 21, the intermediate electrode layer 23, and the upper electrode layer 25 are formed of a conducting material such as tungsten (W), titanium (Ti), polysilicon, for example. A barrier metal layer may be used for the electrode layers 21, 23 and 25 as necessary. Further, a material having a high thermal resistance effect may be used for the electrode layers 21, 23 and 25 for heating the phase-change film 24. The selector layer 22 is formed of a non-ohmic element such as a pin diode configured with a p-type semiconductor layer, an intrinsic semiconductor layer, and an n-type semiconductor layer, for example. The insulating layer 20 is formed of an insulator such as silicon oxide ($SiO_2$), silicon nitride ($Si_3N_4$), for example. The phase-change film 24 is formed of chalcogenide material such as Ge—Sb—Te series (GST series) containing germanium (Ge), antimony (Sb) and tellurium (Te), for example.

The insulating film 26 is formed of diamond-like carbon (DLC), for example. DLC is amorphous and functions as an insulator. The insulating film 26 may be an insulating film other than DLC, such as a glass series film or a metal-oxide film.

The conducting film 27 contains carbon and the thermal conductivity of the conducting film 27 in the in-plane direction (the Z direction on the side surfaces of the phase-change film 24) is greater than the thermal conductivity of the insulating films 26. The conducting film 27 has anisotropy, where the thermal conductivity in the in-plane direction is greater than the thermal conductivity in the film-thickness direction (the X, Y directions on the side surfaces of the phase-change films 24), for example. For example, graphite may be used as such the conducting film 27. Among others, for example a material that has a thermal conductivity in the in-plane direction of 50 W/m·K or greater and a thermal conductivity in the film-thickness direction that is less than or equal to 1/10 of the thermal conductivity in the in-plane direction may be used. For example, a pyrolytic graphite film has a thermal conductivity of several hundred W/m·K and an electrical resistivity of several $\mu\Omega$·m in the in-plane direction and a thermal conductivity of several W/m·K and an electrical resistivity of several thousand $\mu\Omega$·m in the film-thickness direction, and can be used as the conducting film 27 in the present embodiment.

It should be noted that other anisotropic film formed of a laminated structure consisting of a metal film or a metal compound film (such as nitride, carbide, and boride) and an insulating film may be used as the conducting films 27 other than graphite described above. Pyrolytic carbon may also be used as the conducting films 27.

Next, effects of the present embodiment will be described.

The phase-change film 24 is changed to an amorphous state (reset state) by heating to a temperature equal to or higher than the melting temperature and rapid cooling. Further, the phase-change film 24 is changed to a crystallized state (set state) by heating to a temperature lower than the melting temperature and higher than the crystallization temperature and gradually cooling. Therefore, the phase-change film 24 repeats melting and solidification by resetting and setting. In order to increase the memory capacity, further miniaturization of memory cells including the phase-change film 24 and reduction of the array pitch are required. This causes the problem of write errors due to thermal crosstalk between adjacent cells.

In the present embodiment, since the bilayer structure consisting of the insulating film 26 having a low thermal conductivity and the anisotropic high-thermal-conductive conducting film 27 having a thermal conductivity in the in-plane direction that is higher than the thermal conductivity of the insulating films 26 is attached on the side surfaces of the phase-change film 24, heat generated in the phase-change film 24 is not conducted in the direction of the thickness (the X, Y directions) of the insulating film 26 and the conducting film 27 but is conducted in the in-plane direction (the Z direction) of the conducting film 27 and is dissipated through the word line WL1. Therefore, thermal influence between adjacent memory cells MC1 can be effectively blocked.

Incidentally, if the conducting film 27 is graphite, which is anisotropic, for example, forming the conducting film 27 directly on the side surfaces of the phase-change film 24 has drawbacks in terms of adhesiveness and insulation quality. Another problem is that if the conducting film 27 is in direct contact with the phase-change film 24, write electrical power increases because heat applied to the phase-change film 24 during setting/resetting is dissipated through the conducting film 27. To address these problems, adhesiveness and insulation quality between the phase-change film 24 and the conducting film 27 are ensured and reduction of the write electrical power can be achieved by interposing the insulating film 26 between the phase-change film 24 and the conducting film 27. For example, if the insulating film 26 is DLC and the conducting film 27 is graphite, the insulating film 26 provides good adhesiveness as a spacer between the conducting film 27 and the phase-change film 24 because both of the insulating film 26 and the conducting film 27 contain carbon.

Next, a method for manufacturing the semiconductor memory device according to the first embodiment will be described.

Figure 5:
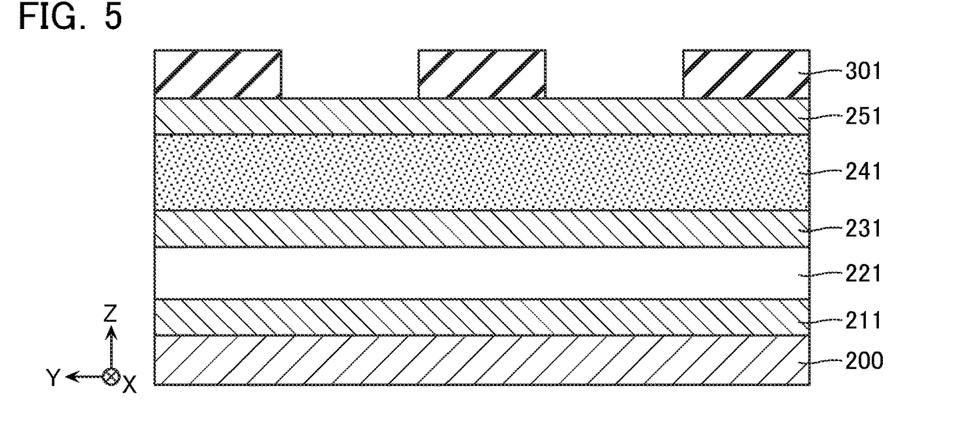
FIG. 5 is a cross-sectional view showing the manufacturing method of the memory mat of the semiconductor memory device.

As shown in FIG. 5, above the semiconductor substrate, not shown, a conducting layer 200 which forms word lines WL, a conducting layer 211 which forms a lower electrode layer 21, a semiconductor layer 221 which forms a selector layer 22, a conducting layer 231 which forms an intermediate electrode layer 23, a chalcogenide film 241 which forms a phase-change film 24, and a conducting layer 251 which forms an upper electrode layer 25 are formed in this order by a method such as ALD (Atomic Layer Deposition) or CVD (Chemical Vapor Deposition). Then, a hard mask 301 is formed on the conducting layer 251 by lithography.

Figure 6:
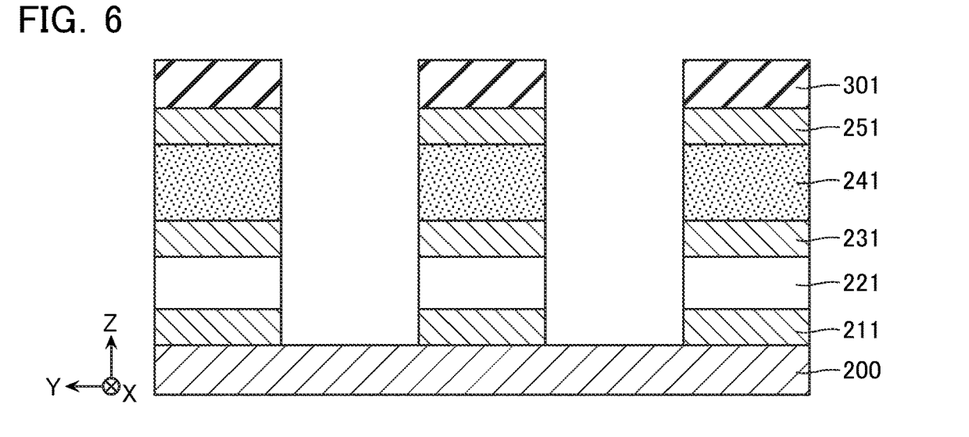
FIG. 6 is a cross-sectional view showing the manufacturing method of the memory mat of the semiconductor memory device.

Then, as shown in FIG. 6, the stacked structure from the conducting layer 251 to the conducting layer 211 is separated in the Y direction by anisotropic etching such as RIE (Reactive Ion Etching), for example, by using the hard mask 301.

Figure 7:
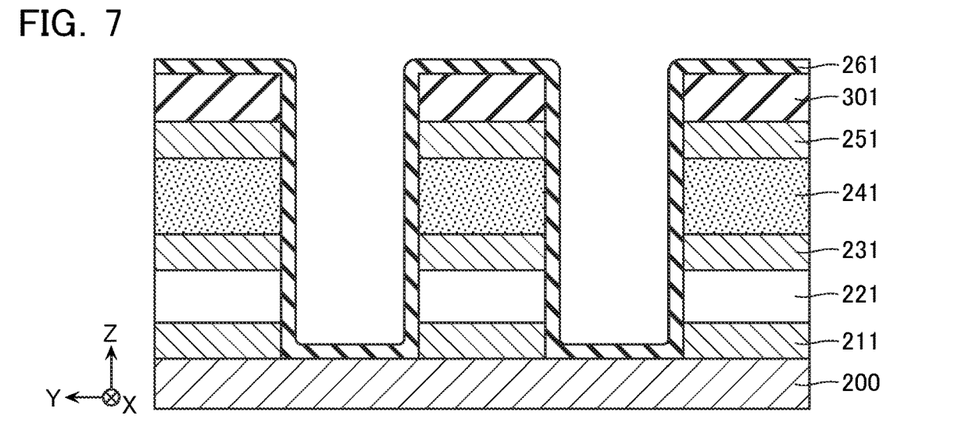
FIG. 7 is a cross-sectional view showing the manufacturing method of the memory mat of the semiconductor memory device.
Figure 8:
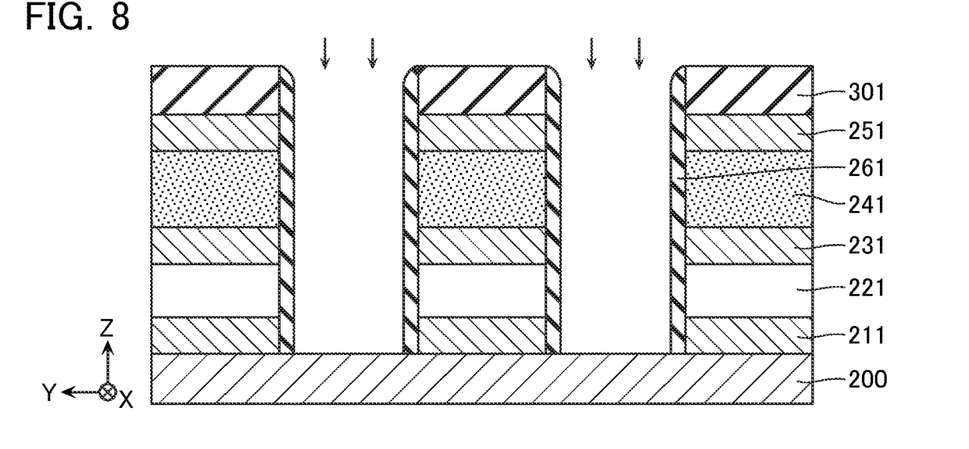
FIG. 8 is a cross-sectional view showing the manufacturing method of the memory mat of the semiconductor memory device.
Figure 9:
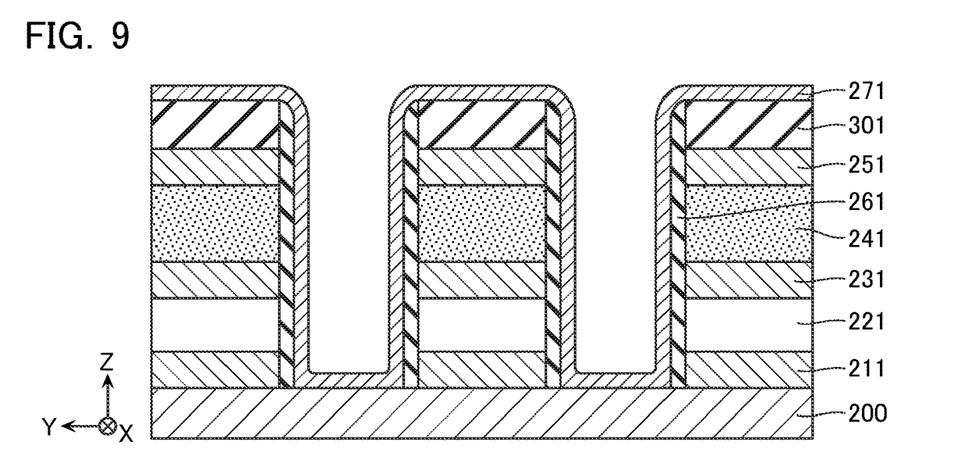
FIG. 9 is a cross-sectional view showing the manufacturing method of the memory mat of the semiconductor memory device.

Then, as shown in FIG. 7, an insulating film 261 which forms an insulating film 26 is formed by a method such as CVD. Then, as shown in FIG. 8, the insulating film 261 on the top surface of the conducting layer 200 is removed by anisotropic etching such as RIE to expose the top surface of the conducting layer 200. Then, as shown in FIG. 9, a conducting film 271 which forms a conducting film 27 is formed. The conducting film 271 may be formed by a method such as thermal CVD or PECVD (Plasma-Enhanced CVD), for example, so as to exhibit anisotropy.

Figure 10:
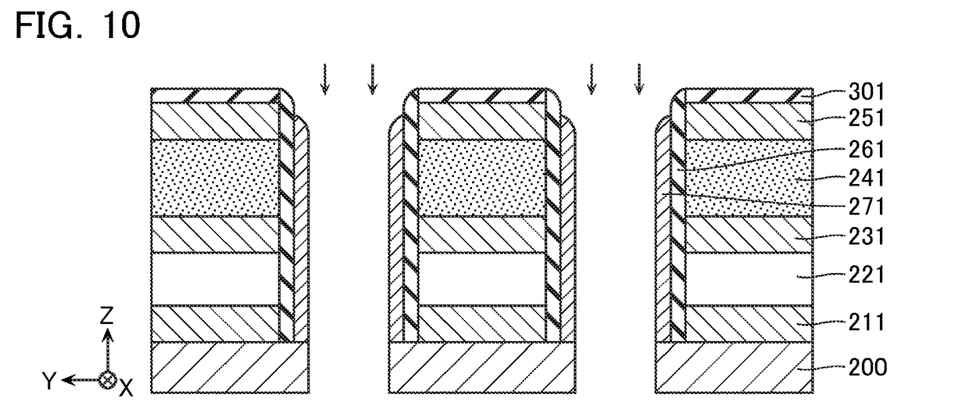
FIG. 10 is a cross-sectional view showing the manufacturing method of the memory mat of the semiconductor memory device.

Then, as shown in FIG. 10, a part of the conducting film 271 and the conducting layer 200 are removed by anisotropic etching such as RIE using the hard mask 301 to separate the stacked structure consisting of the conducting layer 251, the chalcogenide film 241, the conducting layer 231, the semiconductor layer 221, the conducting layer 211, and the conducting layer 200 in the Y direction. During the etching, the upper end of the conducting film 271 in the Z direction is removed in such a way that the upper end of the conducting film 271 is positioned above the upper surface of the chalcogenide film 241 and below the upper surface of the conducting layer 251. The reason is that doing so prevents short circuit between the word line WL1 and the bit line BL through the conducting film 271.

Figure 11:
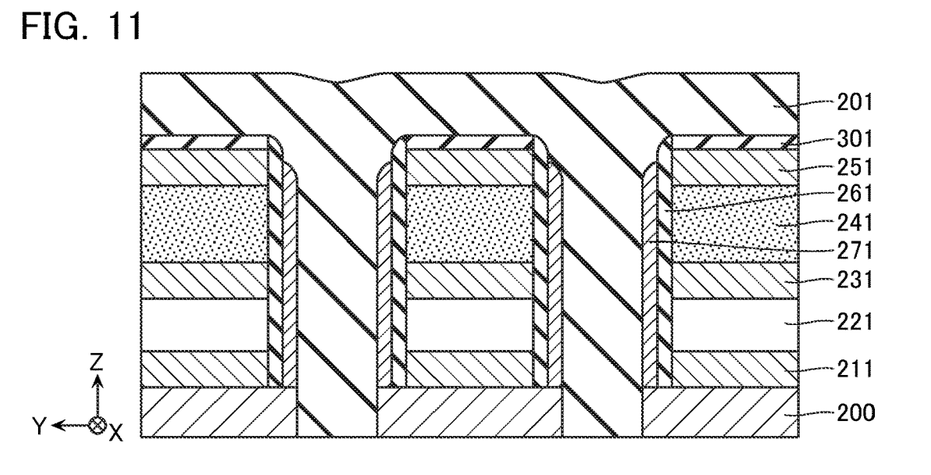
FIG. 11 is a cross-sectional view illustrating the method for fabricating the memory mat of the semiconductor memory device.

Then, as shown in FIG. 11, an insulating layer 201 which forms an insulating layer 20 is formed between the stacked structures resulting from the separation by the etching and the top surface of the conducting layer 251 is exposed by polishing the top surface of the insulating layer 201 and the hard mask 301 by a method such as CMP (Chemical Mechanical Polishing). Then, a conducting layer, not shown, which forms bit lines BL is formed on the exposed conducting layer 251.

By repeating a similar manufacturing process in the X direction as well, the semiconductor memory device as shown in FIG. 4 is manufactured.

Second Embodiment

Figure 12A:
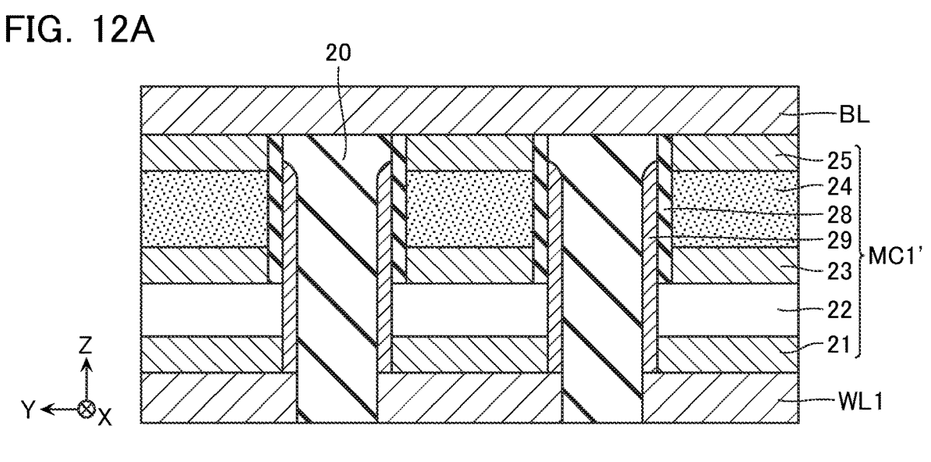
FIGS. 12A-12B are cross-sectional views showing a configuration of a memory mat of a semiconductor memory device according to a second embodiment.
Figure 12B:
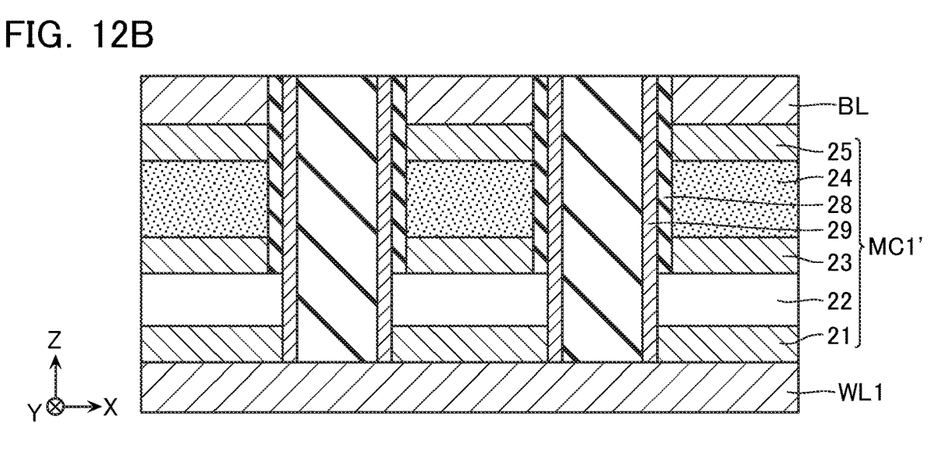

FIGS. 12A and 12B are cross-sectional views showing a part of a semiconductor memory device according to a second embodiment. It should be noted that portions in the present embodiment that are the same as those in the first embodiment are given the same reference numerals and detailed description thereof will be omitted.

In the present embodiment, an insulating film 28 formed on side surfaces of a phase-change film 24 which forms a memory cell MC1' in the XY directions is formed only on the side surfaces of an intermediate electrode layer 23, the phase-change film 24 and an upper electrode layer 25. A conducting film 29 disposed along the side surfaces of the phase-change film 24 with the insulating film 28 interposed between the conducting film 29 and the side surfaces is directly attached on the side surfaces of a lower electrode layer 21 and a selector layer 22.

Next, a method for manufacturing the semiconductor memory device according to the second embodiment will be described.

Figure 13:
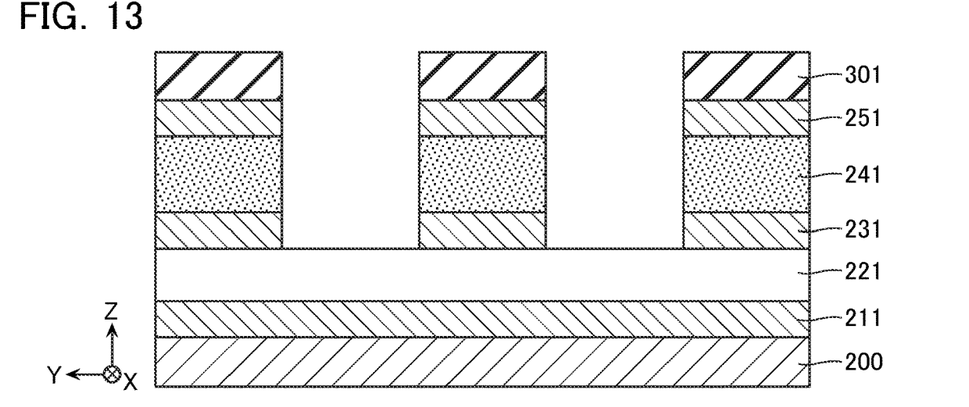
FIG. 13 is a cross-sectional view showing the manufacturing method of the memory mat of the semiconductor memory device.

As shown in FIG. 13, above a semiconductor substrate, not shown, a conducting layer 200 which forms word lines WL, a conducting layer 211 which forms a lower electrode layer 21, a semiconductor layer 221 which forms a selector layer 22, a conducting layer 231 which forms an intermediate electrode layer 23, a chalcogenide film 241 which forms a phase-change film 24, and a conducting layer 251 which forms an upper electrode layer 25 are formed in this order. Then, a hard mask 301 is formed on the conducting layer 251. The stacked structure consisting of the conducting layer 251, the chalcogenide film 241 and the conducting layer 231 is separated in the Y direction by anisotropic etching such as RIE using the hard mask 301.

Figure 14:
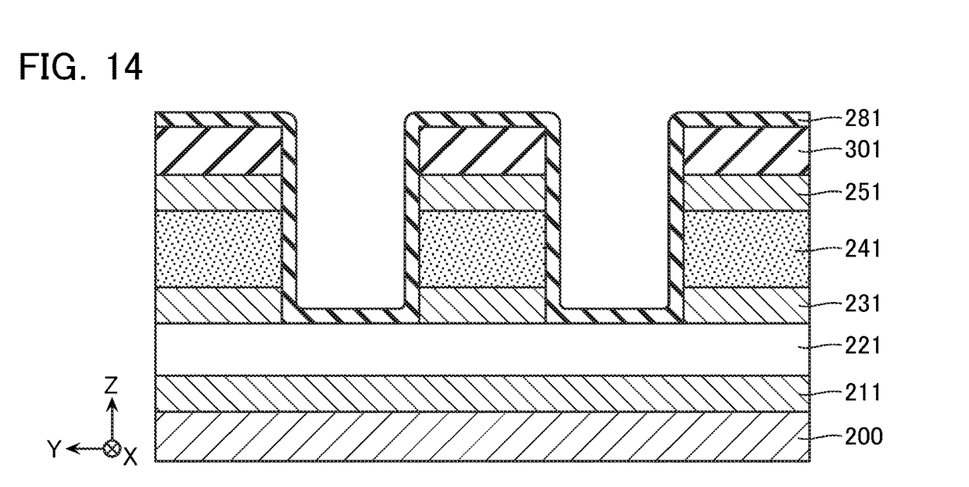
FIG. 14 is a cross-sectional view showing the manufacturing method of the memory mat of the semiconductor memory device.

Then, the upper surface of the stacked structure is coated with an insulating film 281 which forms an insulating film 28 in such a way that the side surfaces of the chalcogenide film 241 is included as shown in FIG. 14.

Figure 15:
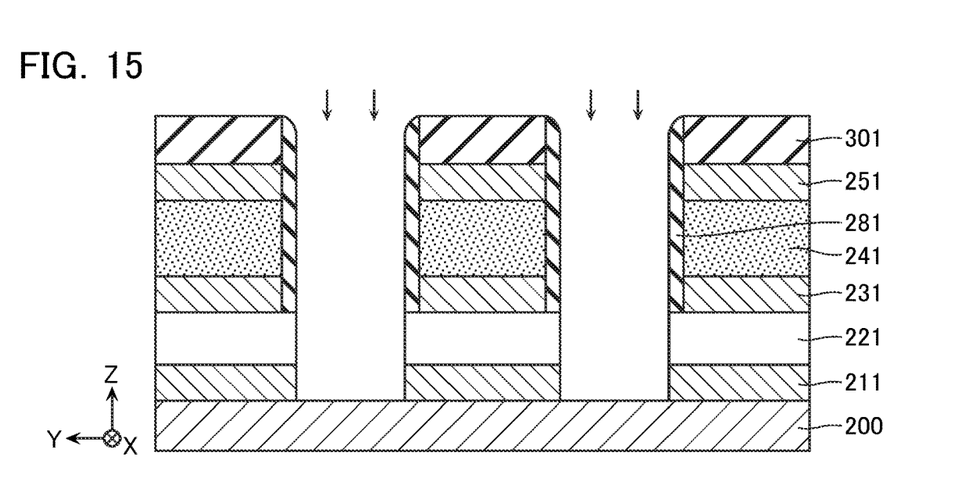
FIG. 15 is a cross-sectional view showing the manufacturing method of the memory mat of the semiconductor memory device.

Then, as shown in FIG. 15, the stacked structure consisting of the insulating film 281, the semiconductor layer 221 and the conducting layer 211 is separated in the Y direction by anisotropic etching such as RIE using the hard mask 301.

Figure 16:
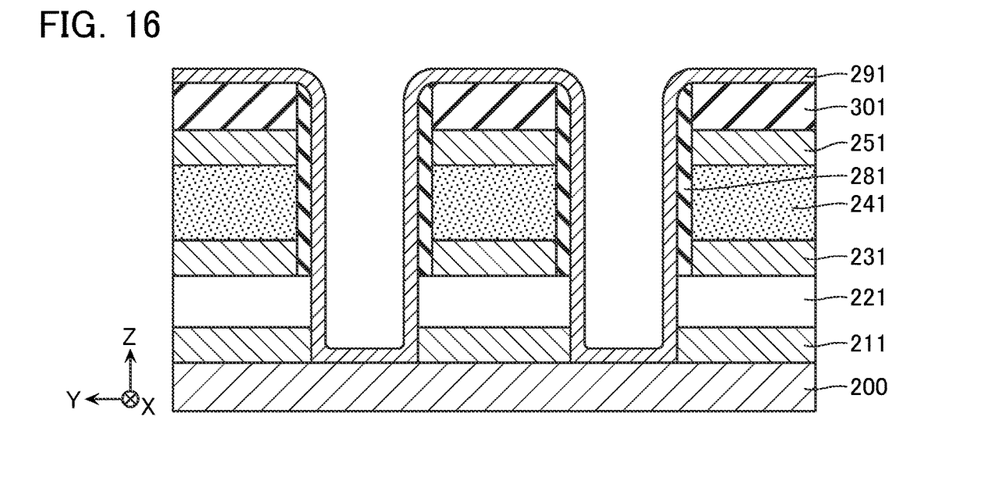
FIG. 16 is a cross-sectional view showing the manufacturing method of the memory mat of the semiconductor memory device.

Then, as showing in FIG. 16, a conducting film 291 which forms a conducting film 29 is formed. The conducting film 291 may be formed by a method such as thermal CVD or PECVD so as to exhibit anisotropy as in the embodiment described above.

Figure 17:
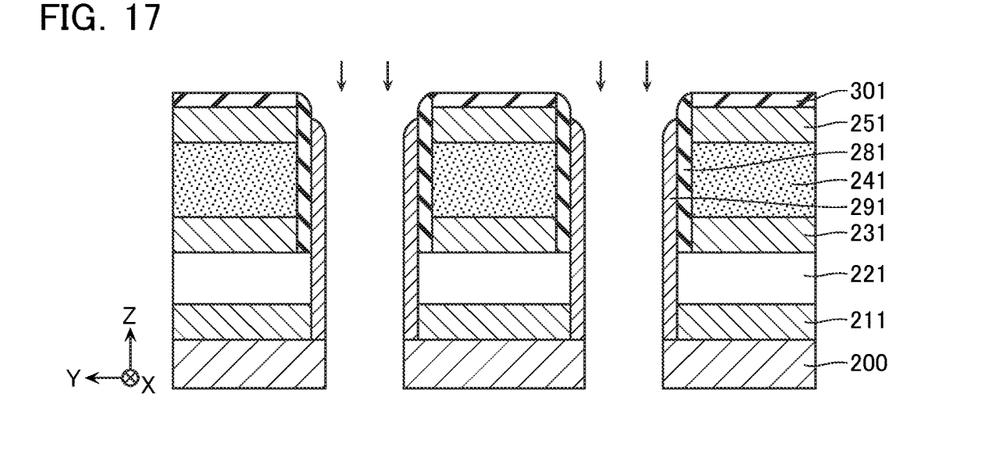
FIG. 17 is a cross-sectional view showing the manufacturing method of the memory mat of the semiconductor memory device.

Then, as shown in FIG. 17, the conducting film 291 and the conducting layer 200 are separated in the Y direction by anisotropic etching such as RIE using the hard mask 301.

Figure 18:
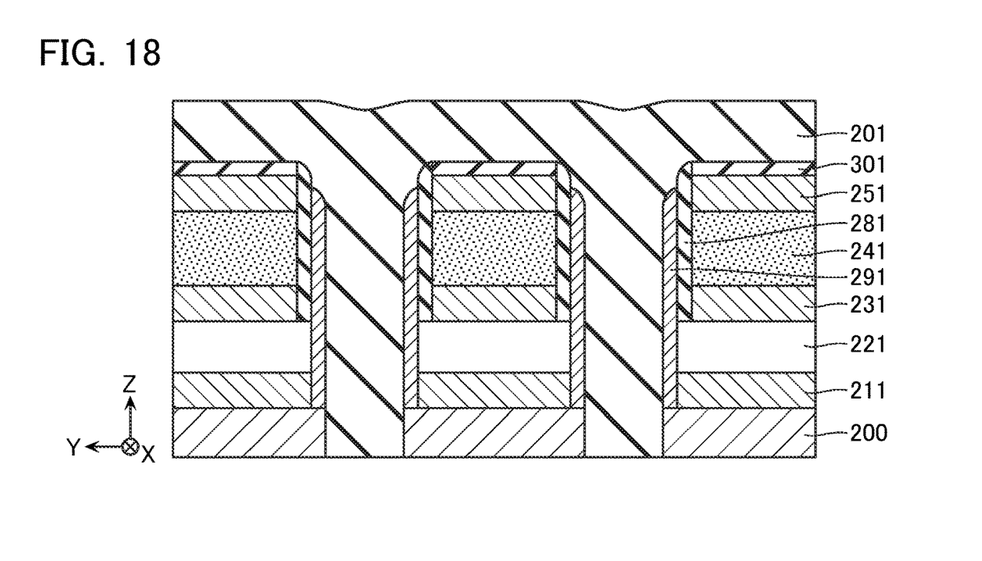
FIG. 18 is a cross-sectional view showing the manufacturing method of the memory mat of the semiconductor memory device.

Then, as shown in FIG. 18, an insulating layer 201 which forms an insulating layer 20 is formed between the stacked structures resulting from the separation by the etching and the upper surface of the conducting layer 251 is exposed by polishing the upper surface of the insulating layer 201 and the hard mask 301 by a method such as CMP. Then, a conducting layer, not shown, which forms bit lines BL is formed on the exposed conducting layer 251.

By repeating a similar manufacturing process in the X direction as well, a semiconductor memory device as shown in FIG. 12 is manufactured.

According to the present embodiment, the duration in which the side surfaces of the chalcogenide film 241, which is easily etched, is exposed to RIE can be reduced because the RIE is ended at the point in time when the conducting layer 251, the chalcogenide film 241 and the conducting layer 231 have been separated in the Y direction in the first anisotropic etching. Further, the formation of the insulating film 281 can protect the side surfaces of the chalcogenide film 241 from damage during the subsequent anisotropic etching.

Third Embodiment

Figure 19:
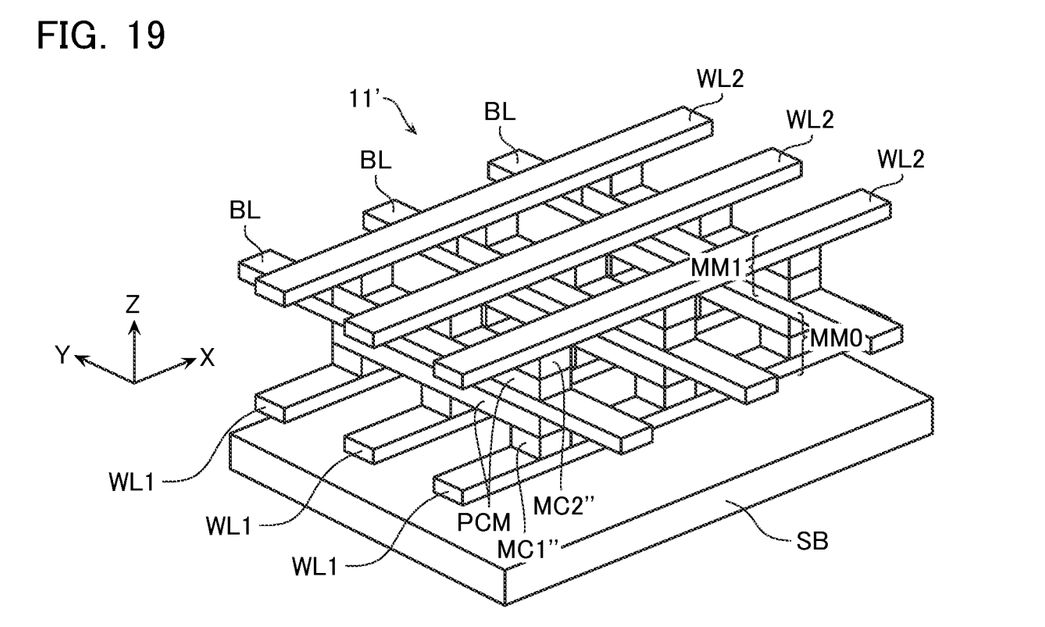
FIG. 19 is a perspective view showing a configuration of a memory cell array of a semiconductor memory device according to a third embodiment.

FIG. 19 is a schematic perspective view showing a configuration of a part of a memory cell array 11' of a semiconductor memory device according to a third embodiment. In the memory cell array 11' according to this embodiment, phase-change films PCM that form memory cells MC1", MC2" extend in the Y direction along the upper and lower surfaces of the bit lines BL.

In such a memory cell array 11', the insulating film 26 and the conducting film 27 may be formed only on the side surfaces of the phase-change films PCM in the X direction.

While certain embodiments have been described, these embodiments have been presented by way of example only, and, are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first electrode and a second electrode opposed to each other in a first direction;
   a phase-change film provided between the first electrode and the second electrode;
   a first film formed of an insulator provided on a side surface of the phase-change film in a second direction intersecting the first direction; and
   a second film formed of a conductor containing carbon and provided along the side surface of the phase-change film in the second direction with the first film interposed between the second film and the side surface.

2. The semiconductor memory device according to claim 1, wherein the first film has a thermal conductivity in an in-plane direction that is greater than a thermal conductivity in a film-thickness direction.

3. The semiconductor memory device according to claim 1, wherein the first film contains carbon.

4. The semiconductor memory device according to claim 3, wherein the first film contains diamond-like carbon.

5. The semiconductor memory device according to claim 1, wherein the second film contains as least one of graphite and pyrolytic carbon.

6. A semiconductor memory device comprising:
- a first electrode and a second electrode opposed to each other in a first direction;
- a phase-change film provided between the first electrode and the second electrode;
- a first film provided on a side surface of the phase-change film in a second direction intersecting the first direction; and
- a second film provided along the side surface of the phase-change film in the second direction with the first film interposed between the second film and the side surface; wherein
- the first film is formed of an insulator; and
- the second film is formed of a conductor having a thermal conductivity in an in-plane direction that is greater than the thermal conductivity in a film-thickness direction.

7. The semiconductor memory device according to claim 6, wherein the first film contains carbon.

8. The semiconductor memory device according to claim 7, wherein the first film contains diamond-like carbon.

9. The semiconductor memory device according to claim 6, wherein the second film contains carbon.

10. The semiconductor memory device according to claim 9, wherein the second film contains graphite or pyrolytic carbon.

11. The semiconductor memory device according to claim 6, wherein the second film is a laminated structure consisting of a metal film or a metal compound film and an insulting film.

12. The semiconductor memory device according to claim 6, further comprising a first wiring and a second wiring that form current paths with the first electrode, the phase-change film and the second electrode interposed between the first wiring and the second wiring,
wherein the second film is connected to the first wiring or the second wiring.

13. A semiconductor memory device comprising:
- a first wiring extending in a first direction;
- a second wiring extending in a second direction intersecting the first direction;
- a third wiring adjacent to the second wiring in the first direction and extending in the second direction;
- a first stacked structure provided between the first wiring and the second wiring and including a first resistance change layer and a first electrode;
- a second stacked structure provided between the first wiring and the third wiring and including a second resistance change layer and a second electrode;
- a first film provided between the first stacked structure and the second stacked structure and in contact with the first stacked structure; and
- a second film provided between the second stacked structure and the first film and formed of a conductor that is in contact with the first film and contains carbon.

14. The semiconductor memory device according to claim 13, further comprising:
- a third film provided between the second stacked structure and the second film and in contact with the second stacked structure; and
- a fourth film provided between the third film and the second film and formed of a conductor in contact with the third film and containing carbon.

15. The semiconductor memory device according to claim 14, further comprising an insulating layer provided between the second film and the fourth film.

16. The semiconductor memory device according to claim 13, wherein the first stacked structure includes a first selector and the second stacked structure includes a second selector.

17. The semiconductor memory device according to claim 13, further comprising:
- a fourth wiring adjacent to the first wiring in the second direction and extending in the first direction;
- a third stacked structure provided between the fourth wiring and the second wiring and including a third resistance change layer and a third electrode;
- a fifth film provided between the third stacked structure and the first stacked structure and in contact with the third stacked structure; and
- a sixth film provided between the fifth film and the first stacked structure and formed of a conductor that is in contact with the fifth film and contains carbon.

18. The semiconductor memory device according to claim 17, further comprising a third selector in the third stacked structure.

19. The semiconductor memory device according to claim 13, wherein the first film contains diamond-like carbon.

20. The semiconductor memory device according to claim 13, wherein the second film contains graphite or pyrolytic carbon.

* * * * *